United States Patent
Kim et al.

(10) Patent No.: US 7,129,541 B2
(45) Date of Patent: Oct. 31, 2006

(54) FIELD EFFECT TRANSISTORS INCLUDING VERTICALLY ORIENTED GATE ELECTRODES EXTENDING INSIDE VERTICALLY PROTRUDING PORTIONS OF A SUBSTRATE

(75) Inventors: Sung-Min Kim, Incheon-si (KR);
Hye-Jin Cho, Gyeonggi-do (KR);
Shin-Ae Lee, Gyeonggi-do (KR);
Eun-Jung Yun, Seoul (KR); Dong-Gun Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/945,246

(22) Filed: Sep. 20, 2004

(65) Prior Publication Data

US 2005/0062109 A1    Mar. 24, 2005

(30) Foreign Application Priority Data

Sep. 19, 2003    (KR) ...................... 10-2003-0065128

(51) Int. Cl.
*H01L 29/76* (2006.01)
*H01L 29/94* (2006.01)
*H01L 31/062* (2006.01)
*H01L 3/113* (2006.01)
*H01L 31/119* (2006.01)

(52) U.S. Cl. ..................... 257/330; 257/331; 257/332

(58) Field of Classification Search ........ 257/314–324, 257/328–333
See application file for complete search history.

(56) References Cited

U.S. PATENT DOCUMENTS 5,614,749 A * 3/1997 Ueno .......................... 257/330
6,093,606 A * 7/2000 Lin et al. ..................... 257/315
6,335,247 B1   1/2002 Tews et al. .................. 438/270
2002/0056884 A1* 5/2002 Baliga ......................... 257/330
2002/0137271 A1* 9/2002 Forbes et al. ............... 257/315

OTHER PUBLICATIONS

Yeo, et al., "Design and Fabrication of 50-nm Thin-Body p-MOSFETs With a SiGe Heterostructure Channel," *IEEE Transactions of Electron Devices*, vol. 49, No. 2, Feb. 2002.

Kedzierski et al., "A 20 nm Gate-Length Ultra-Thin-Body p-MOSFET With Silicide Source/Drain," *Superlattices and Microstructures*, vol. 28, No. 5/6 2000.

* cited by examiner

*Primary Examiner*—Cuong Nguyen
(74) *Attorney, Agent, or Firm*—Myers Bigel Sibley & Sajovec, PA

(57) ABSTRACT

A field effect transistor on an active region of a semiconductor substrate includes a vertically protruding thin-body portion of the semiconductor substrate and a vertically oriented gate electrode at least partially inside a cavity defined by opposing sidewalls of the vertically protruding portion of the substrate. The transistor further includes an insulating layer surrounding an upper portion of the vertically oriented gate electrode and a laterally oriented gate electrode on the insulating layer and connected to a top portion of the vertically oriented gate electrode. Accordingly, a T-shaped gate electrode is defined having a lateral portion on a top surface of a semiconductor substrate and having a vertical portion at least partially inside a cavity defined by opposing sidewalls of a vertically protruding portion of the substrate.

18 Claims, 19 Drawing Sheets

Fig. 13A
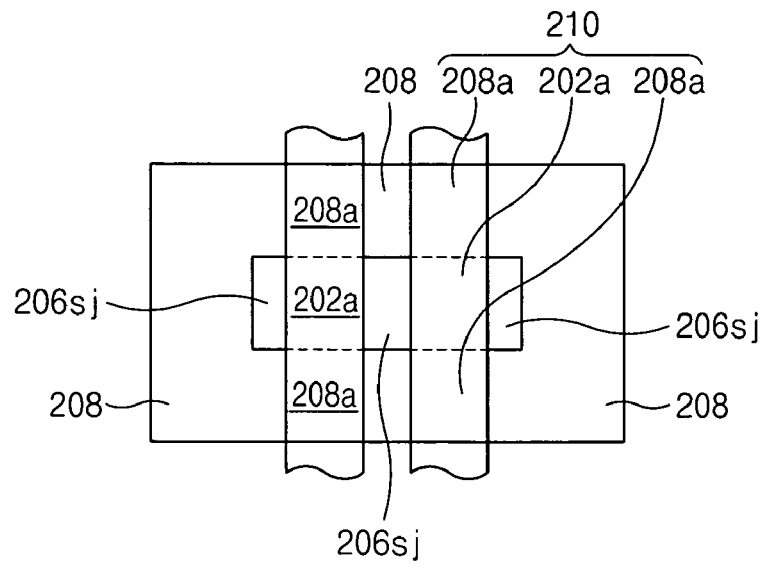
Fig. 13B
Fig. 13C
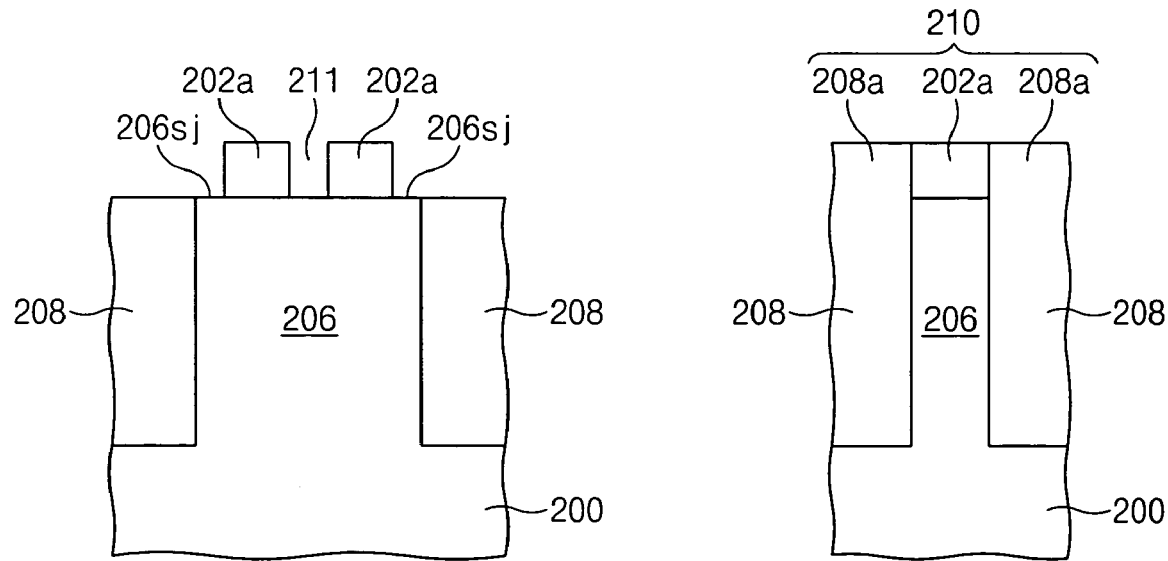

FIELD EFFECT TRANSISTORS INCLUDING VERTICALLY ORIENTED GATE ELECTRODES EXTENDING INSIDE VERTICALLY PROTRUDING PORTIONS OF A SUBSTRATE

CROSS-REFERENCE TO RELATED APPLICATIONS

This U.S. non-provisional patent application claims priority under 35 U.S.C. § 119 of Korean Patent Application 2003-65128 filed on Sep. 19, 2003, the entire contents of which are hereby incorporated by reference.

BACKGROUND OF THE INVENTION

The present invention relates to semiconductor devices, and more specifically, to thin body transistors and methods for fabricating the same.

In recent years, semiconductor devices have become highly integrated to achieve a combination of high-performance, a high-speed, and economic efficiency. However, as semiconductor devices become more highly integrated, a variety of operational and structural problems may arise. For example, as the channel length of a typical planar field effect transistor becomes shorter, short channel effects (such as punch-through) may occur, parasitic capacitance (i.e. a junction capacitance) between junction regions and the substrate may be increased, and leakage current may be increased.

To address some of the above problems, thin body field effect transistors using silicon-on-insulator (SOI) technology have been proposed. However, such devices may be susceptible to floating body effects, which may be caused by heat generated during device operation and/or an accumulation of high-energy hot carriers. In addition, a back bias voltage may not applied to compensate for changes in threshold voltage because of the insulator, so device performance may be affected. Also, problems associated with stress due to differences in thermal expansion coefficients between the substrate and the insulating layer may occur. Furthermore, since SOI field effect transistor technology may require connecting two substrates, processing costs may be increased and fabrication may become relatively complicated.

SUMMARY OF THE INVENTION

According to some embodiments of the present invention, a field-effect transistor on an active region of a semiconductor substrate may include a vertically protruding thin-body portion of the semiconductor substrate and a vertically oriented gate electrode at least partially inside a cavity defined by opposing sidewalls of the vertically protruding portion of the substrate.

In further embodiments, the transistor may include an insulating layer surrounding an upper portion of the vertically oriented gate electrode, and a laterally oriented gate electrode on the insulating layer and connected to a top portion of the vertically oriented gate electrode. The vertically oriented gate electrode may be formed of silicide, and the laterally oriented gate electrode may be formed of one of polysilicon, metal, and metal silicide. In addition, the laterally oriented gate electrode may have a width that is greater than a width of the vertically oriented gate electrode. The transistor may also include spacers surrounding the upper portion of the vertically oriented gate electrode between the vertically oriented gate electrode and the insulating layer.

In other embodiments, the transistor may include a lower insulating layer inside the cavity between a bottom portion of the vertically oriented gate electrode and the substrate. Also, the vertically oriented gate electrode may have a lower portion inside the cavity and an upper portion outside the cavity, wherein the upper portion has a width greater than a width of the lower portion.

In some embodiments according to the present invention, a field effect transistor in a non-volatile EPROM may include a T-shaped gate electrode having a lateral portion on a top surface of a semiconductor substrate and having a vertical portion at least partially inside a cavity defined by opposing sidewalls of a vertically protruding portion of the substrate. In other embodiments, the T-shaped gate electrode may be a first T-shaped gate electrode and the cavity may be a first cavity. The transistor may further include a second T-shaped gate electrode having a lateral portion on a top surface of the substrate and having a vertical portion at least partially inside a second cavity defined by opposing sidewalls of the vertically protruding portion of the substrate. The lateral portion of the second T-shaped gate electrode may be substantially parallel to the lateral portion of the first T-shaped gate electrode, and the vertical portion of the second T-shaped gate electrode may be substantially parallel to the vertical portion of the first T-shaped gate electrode.

In additional embodiments, a field effect transistor in a non-volatile EPROM may include a vertically extending gate electrode at least partially surrounded by a thin-body portion of a semiconductor substrate where a channel is to be formed.

In yet other embodiments, a field effect transistor in a non-volatile EPROM may include a U-shaped thin-body portion of a semiconductor substrate where a channel is to be formed and a vertically extending gate electrode on opposing inner sidewalls of the U-shaped portion of the substrate.

According to further embodiments of the present invention, a method of forming a field effect transistor on an active region of a semiconductor substrate may include forming a cavity in a vertically protruding thin-body portion of the substrate, and filling the cavity to form a vertically oriented gate electrode having at least a lower portion inside the cavity. The cavity may be defined by opposing sidewalls of the vertically protruding portion of the substrate.

In some embodiments, the method may include forming an insulating layer surrounding an upper portion of the vertically oriented gate electrode, and forming a laterally oriented gate electrode on the insulating layer. The laterally oriented gate electrode may be connected to a top portion of the vertically oriented gate electrode. In other embodiments, the vertically oriented gate electrode and the laterally oriented gate electrode may be formed simultaneously.

In further embodiments, filling the cavity may include filling the cavity in the vertically protruding portion of the substrate with polysilicon, forming a heat-resistant metal layer on the surface of the substrate, and applying a thermal treatment process to the substrate to form a vertically oriented gate electrode having at least a lower portion inside the cavity. Filling the cavity may further include controlling a thickness of the heat resistant metal layer and the duration of the thermal treatment process to form the vertically oriented gate electrode in the cavity.

In some embodiments, the method may include forming spacers on the substrate before forming the cavity in the channel region to control a width of the channel region. The method may further include forming a lower insulating layer in the cavity between a bottom of the vertically oriented gate electrode and the substrate. In addition, the method may include performing an ion implantation process after forming the insulating layer.

In other embodiments, a method of forming a field effect transistor in a non-volatile EPROM may include forming a T-shaped gate electrode having a lateral portion on a top surface of a semiconductor substrate and having a vertical portion at least partially inside a cavity defined by opposing sidewalls of the substrate.

BRIEF DESCRIPTION OF THE DRAWINGS

FIGS. 2A through 11A are perspective views illustrating methods for fabricating a semiconductor device according to some embodiments of the present invention shown in FIG. 1A;

FIGS. 2B through 11B are cross-sectional views illustrating methods for fabricating a semiconductor device according to some embodiments of the present invention corresponding to FIGS. 2A through 11A, taken along a line I—I in FIG. 1A;

FIGS. 2C through 11C are cross-sectional views illustrating methods for fabricating a semiconductor device according to some embodiments of the present invention corresponding to FIGS. 2A through 11A, taken along line II—II in FIG. 1A; and FIGS. 12A through 19A are overhead views illustrating methods for fabricating a semiconductor device according to further embodiments of the present invention;

FIGS. 12B through 19B are cross-sectional views illustrating methods for fabricating a semiconductor device according to some embodiments of the present invention corresponding to FIGS. 12A through FIG. 19A, taken along line I—I in FIG. 12A; and FIGS. 12C through 19C are cross-sectional views illustrating methods for fabricating a semiconductor device according to some embodiments of the present invention corresponding to FIGS. 12A through FIG. 19A, taken along line II—II in FIG. 12A.

DETAILED DESCRIPTION OF PREFERRED EMBODIMENTS

Figure 1A:
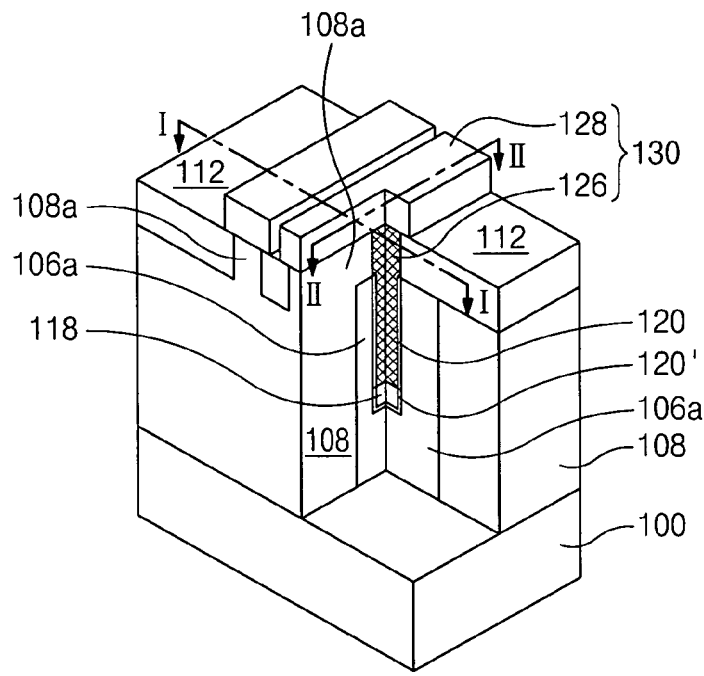
FIG. 1A is a perspective view of a semiconductor device according to some embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will also be understood that the term "and/or" as used herein refers to and encompasses any and all possible combinations of one or more of the associated listed items.

Furthermore, relative terms such as beneath may be used herein to describe one layer or region's relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

The terminology used in the description of the invention herein is for the purpose of describing particular embodiments only and is not intended to be limiting of the invention. As used in the description of the invention and the appended claims, the singular forms "a", "an " and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

The present invention relates to field effect transistors, and more specifically to thin body transistors without an SOI substrate. A conventional thin body transistor on an SOI substrate may have a horizontal channel, and may include a buried oxide layer (BOX), a thin body, and a gate electrode which are stacked in sequential order on the substrate. However, a thin body transistor according to some embodiments of the present invention has a vertical channel (i.e., a vertical thin body), and has a structure such that a portion of the gate electrode is vertically oriented to fill a region between portions of the vertical thin body (i.e., the gate electrode is surrounded by the vertical thin body). In other words, at least a portion of the vertically oriented gate electrode is inside a cavity within the thin body. In other embodiments, the gate electrode may include a horizontally or laterally oriented portion and a vertically oriented portion (forming the shape of a 'T'), and the vertical thin bodies may surround the vertically oriented portion of the gate electrode.

Figure 1B:
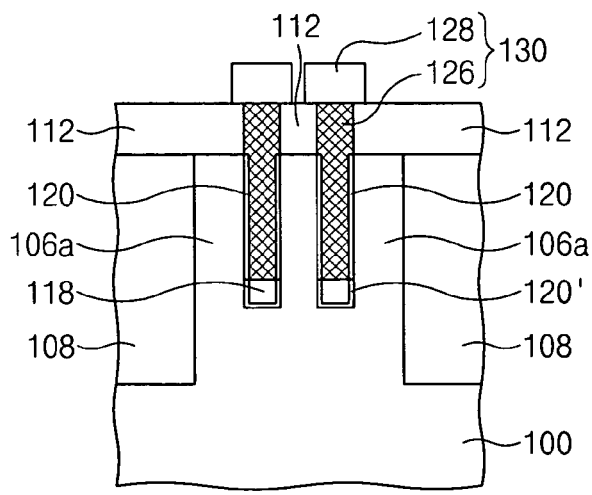
FIG. 1B is a cross-sectional view of a semiconductor device according to some embodiments of the present invention taken along line I—I in FIG. 1A.
Figure 1C:
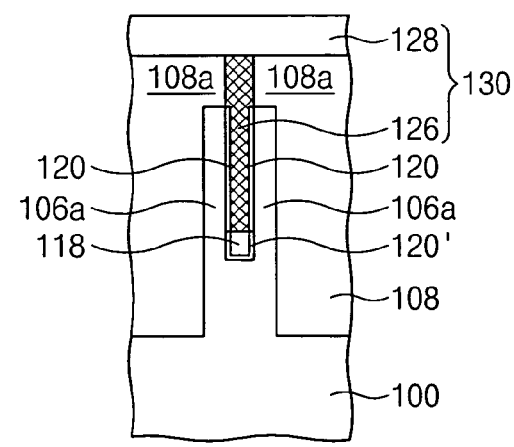
FIG. 1C is a cross-sectional view of a semiconductor device according to some embodiments of the present invention taken along line II—II in FIG. 1A.

Vertical thin body transistors according to some embodiments of the present invention will now be described with reference to the accompanying drawings. FIG. 1A is a perspective view illustrating a field effect transistor according to some embodiments of the present invention. FIGS. 1B and 1C are cross-sectional views illustrating the field effect transistor of FIG. 1A, taken along lines I—I and II—II of FIG. 1A.

Referring to FIGS. 1A through 1C, a transistor according to some embodiments of the present invention includes a gate line 130 and a vertically protruding thin body portion 106a of the semiconductor substrate 100 where an inversion layer channel may be formed. The gate line 130 includes a laterally oriented portion 128 and a vertically oriented portion 126, forming a T-shape. A first opening or cavity 116 is defined within the vertical thin body 106a by opposing sidewalls of the vertically protruding portion of the substrate 100. In other words, the first opening or cavity 116 may be defined by a U-shaped portion of the substrate 100. Upper insulating layers 112 and 108a are formed on the vertical thin body 106a. The upper insulating layers 112 and 108a have a second opening 114 aligned with the first opening or cavity 116. The upper insulating layer 108a may be a device isolating layer. The vertically oriented portion 126 of the gate line 130 is at least partially surrounded by the vertical thin body 106a and the upper insulating layers 112 and 108a. In other words, the vertically extending portion 126 of the gate line 130 fills the first opening or cavity 116 in the vertical thin body 106a and the second opening 114 in the upper insulating layers 112 and 108a. An upper portion of the vertically oriented portion 126 of the gate line 130 may be higher than the vertical thin body 106a. Also, the upper portion of the vertically oriented portion 126 of the gate line 130 may have a width greater than a lower portion of the vertically oriented portion 126 of the gate line 130 inside the opening or cavity 116. The laterally oriented portion 128 of the gate line 130 covers the vertically oriented portion 126 of the gate line 130, and passes over a top surface of the upper insulating layers 112 and 108a.

The vertically oriented portion 126 of the gate line 130 may be formed of silicide or polysilicon. The laterally oriented portion 128 of the gate line 130 may be formed of polysilicon, metal (such as tungsten) or silicide. Silicides may includes tungsten silicide, nickel silicide, titanium silicide or chrome silicide, etc.

In addition, the width of the laterally oriented portion 128 of the gate line 130 is wider than that of vertically oriented portion 126 of the gate line 130.

A gate insulating layer 120 is formed on the bottom and on inner sidewalls of the first opening or cavity 116.

Preferably, a lower insulating layer 118 is formed between the bottom of the vertically extending portion 126 of the gate line 130 and the gate insulating layer 120' on a bottom of the first opening or cavity 116. In such a case, an upper region of the thin body 106a adjacent to both sidewalls of the vertically extending portion 126 of the gate line 130 provides a region where an inversion-layer channel may be formed when the transistor is disposed in a forward on-state mode of operation. However, an inversion-layer channel may not be formed at the lower portion of the thin body 106a due to the lower insulating layer 118.

Now referring to FIGS. 2A through 11A, FIGS. 2B through 11B and FIGS. 2C through 11C, a method for fabricating semiconductor devices according to embodiments of the present invention illustrated in FIGS. 1A through 1C will be described. FIGS. 2B through 11B and FIGS. 2C through 11C are cross-sectional views corresponding to FIGS. 2A through 11A, taken along line I—I and line II—II in FIG. 1A, respectively.

Figure 2A:
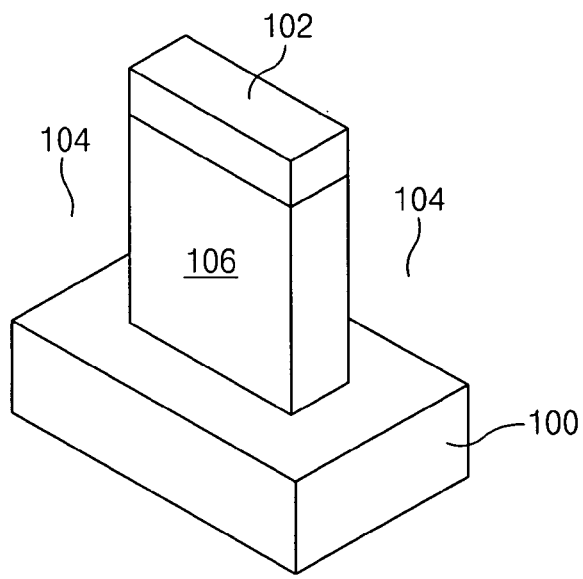
Figure 2B:
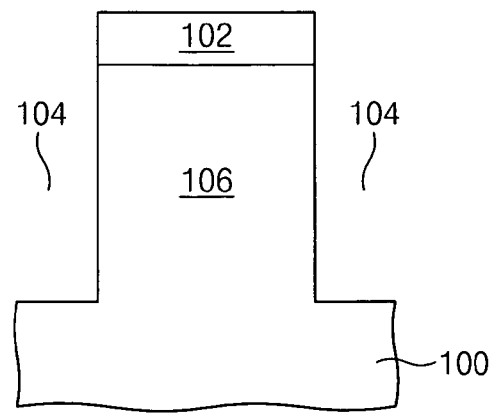
Figure 2C:
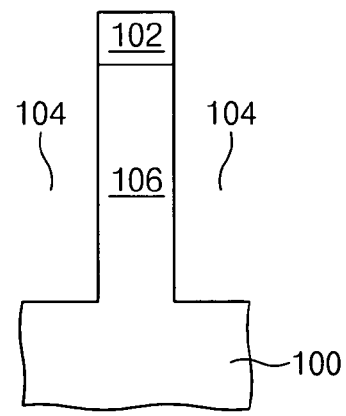

Referring to FIGS. 2A through 2C, a mask pattern 102 is formed on a semiconductor substrate 100. The exposed substrate is then etched using the mask pattern 102 as an etch mask to form a trench 104 and to define an active region 106 where a thin-body channel region is to be formed. Although only one active region is illustrated, a plurality of active regions may be formed simultaneously in a predetermined arrangement on the substrate 100. In addition, even though a top portion of the active region 106 is illustrated as rectangular, the top portion may be formed to various shapes.

The mask pattern 102 may be formed by stacking a silicon oxide layer and a silicon nitride layer. In such a case, the silicon oxide layer may be formed by thermally oxidizing a substrate, and the silicon nitride layer may be formed using chemical vapor deposition (CVD).

Figure 3A:
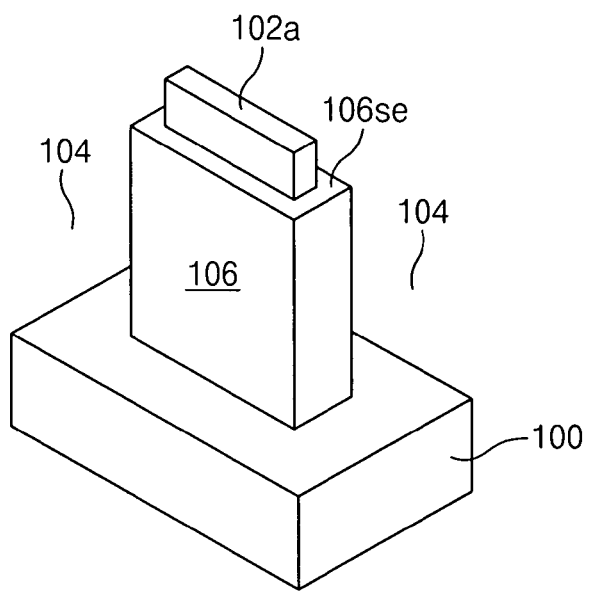
Figure 3B:
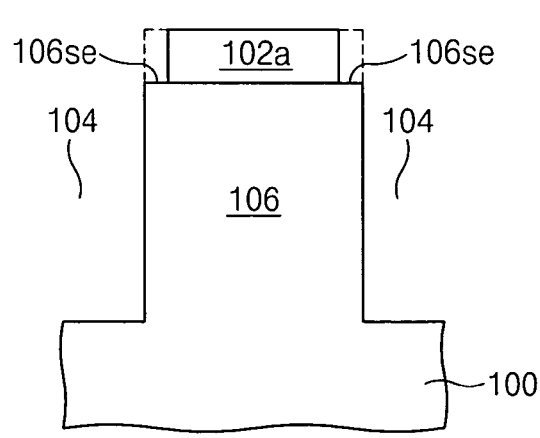
Figure 3C:
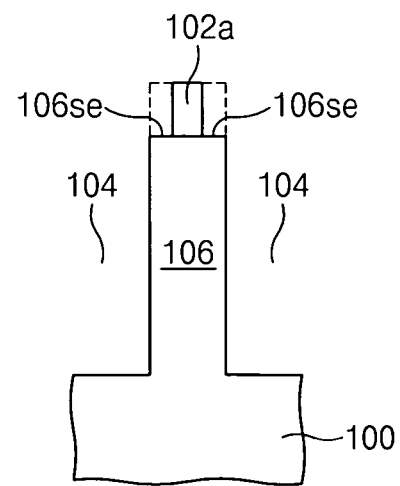

Referring to FIGS. 3A through 3C, a portion of mask pattern 102 is removed to form a shrunken mask pattern 102a, exposing an edge 106se at the top surface of the active region 106. The width of edge 106se may determine a width of the thin body (i.e., the width of the channel). In other words, a predetermined portion of the mask pattern 102 may be removed to form a thin body portion of the substrate 100 having a desired thickness. For example, using an etchant, a portion of the mask pattern 102 may be removed. A phosphoric acid solution may be used to remove the silicon nitride layer, and a fluoric acid solution may be used to remove the silicon oxide layer. Other etchants well known to those skilled in the art may also be used.

Figure 4A:
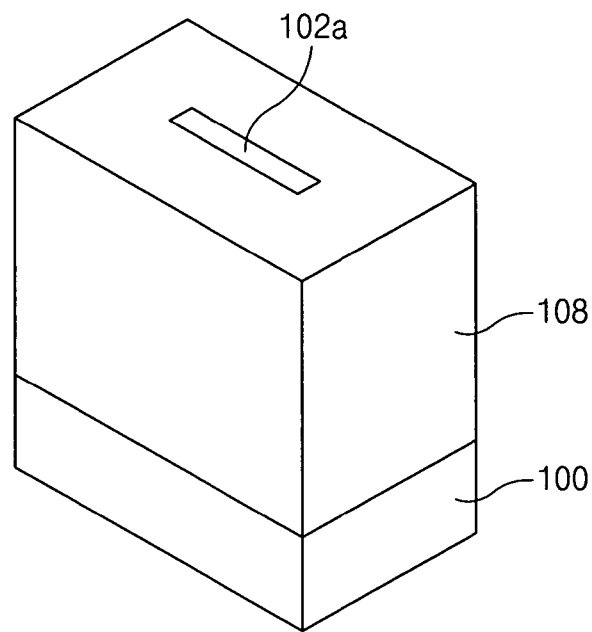
Figure 4B:
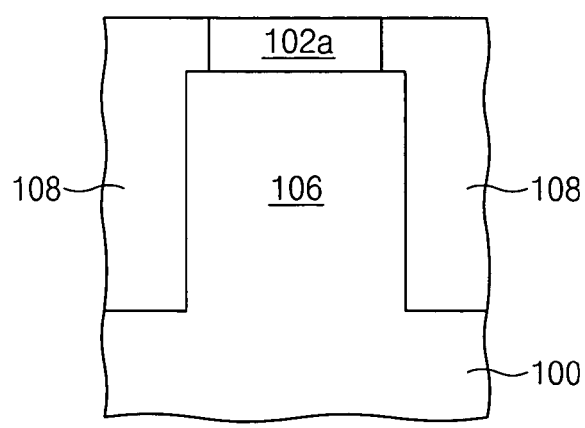
Figure 4C:
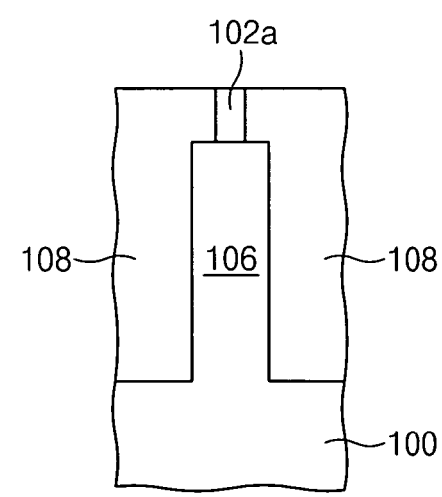

Referring to FIGS. 4A through 4C, a trench 104 is filled with insulating material to form a device isolating layer 108. More specifically, after the insulating material is formed to fill the trench 104, the insulating material is removed until the shrunken mask pattern 102a is exposed, for example, by a planarization process such as chemical-mechanical polishing (CMP). The insulating material may be silicon oxide. Although not illustrated in the drawings, a thermal oxidation process may be used to cure etching damage to the substrate, and a silicon nitride layer may be formed on inner sidewalls of the trench as an oxidation barrier layer prior to filling the trench with the insulating material.

Figure 5A:
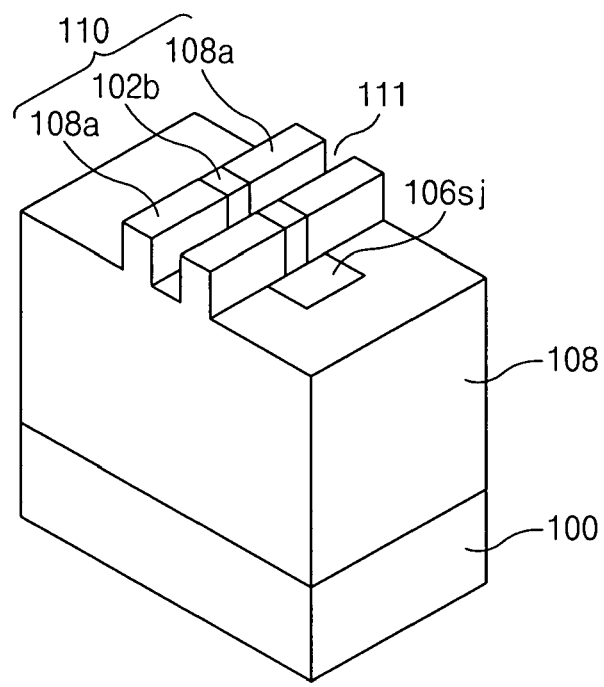
Figure 5B:
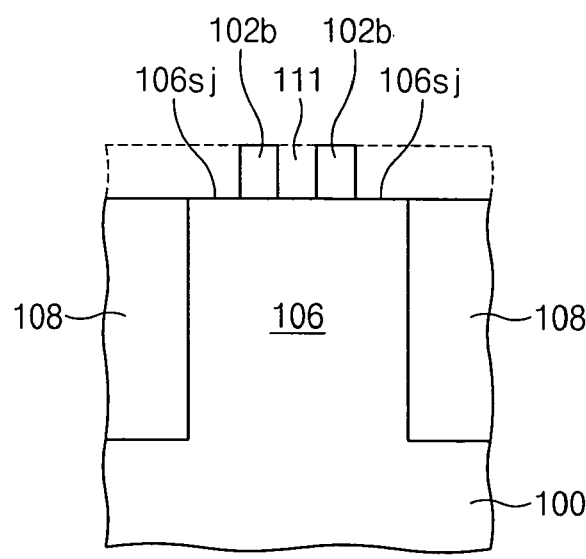
Figure 5C:
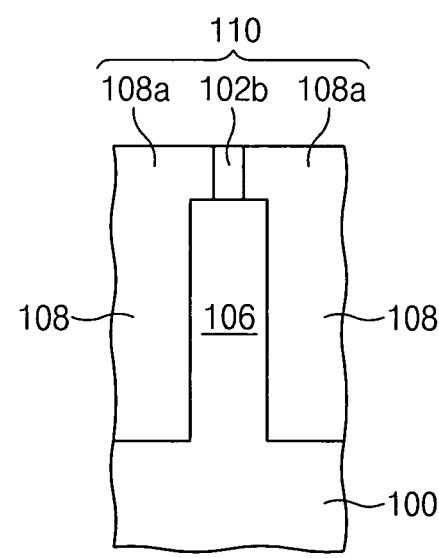

Referring to FIGS. 5A through 5C, the device isolating layer 108 and the shrunken mask pattern 102a are patterned to form a dummy gate line 110 over the active region 106. More specifically, an etch mask (not shown) defining the dummy gate line 110 is formed on the device isolating layer 108 and the shrunken mask pattern 102a. The portions of the device isolating layer 108 and the shrunken mask pattern 102a that are exposed by the etch mask are etched until a top surface 106sj of the active region 106 is exposed. The dummy gate line 110 comprises a patterned shrunken mask pattern 102b and a patterned device isolating layer 108a (i.e., a portion of the device isolating layer 108 extending over the active region 106). The source/drain regions for the transistor may be formed at the exposed top portions 106sj of the active region 106 in a subsequent process.

Figure 6A:
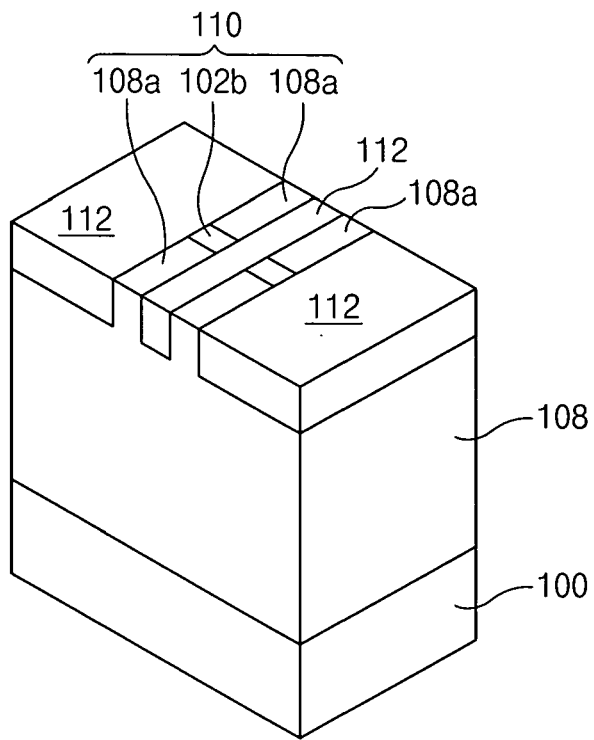
Figure 6B:
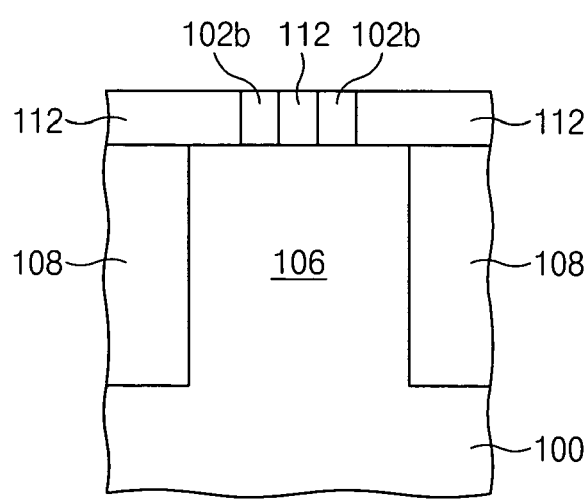
Figure 6C:
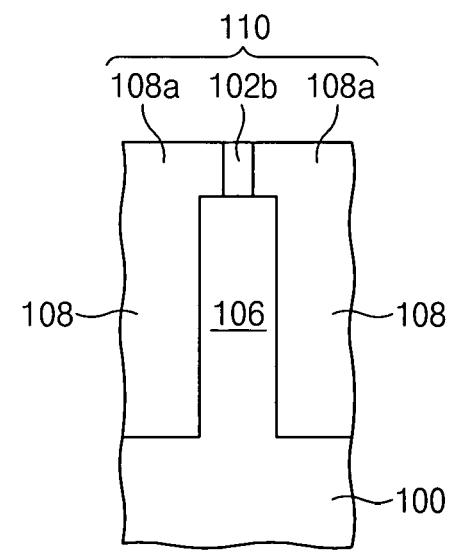

After the etch mask for defining the dummy gate line 110 is removed, an insulating layer 112 is formed to fill the space 111 between the dummy gate lines 110, as illustrated in FIGS. 6A through 6C. More specifically, insulating material is formed on the substrate 100 over the dummy gate line 110 to fill the space 111 between the dummy gate lines 110, and then a planarization process is performed until the shrunken mask pattern 102b is exposed. The insulating layer 112 may be formed of silicon oxide. As such, the shrunken mask pattern 102b portion of the dummy gate line 110 remains on the top surface of the active region 106, surrounded by the patterned device isolating layer 108a and the insulating layer 112. The insulating layer 112 may serve as a buffer layer in a subsequent ion-implantation process for forming source/drain regions.

Figure 7A:
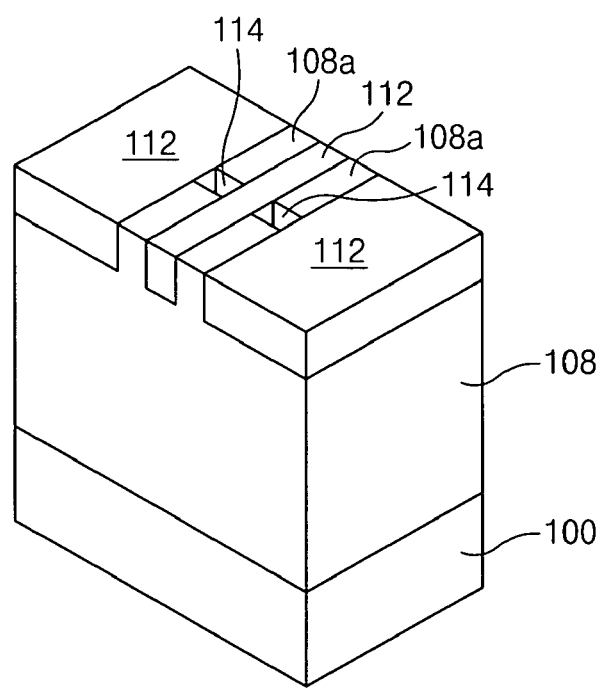
Figure 7B:
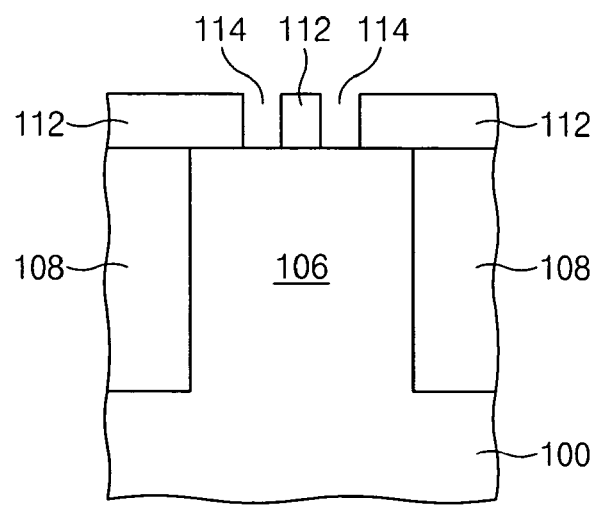
Figure 7C:
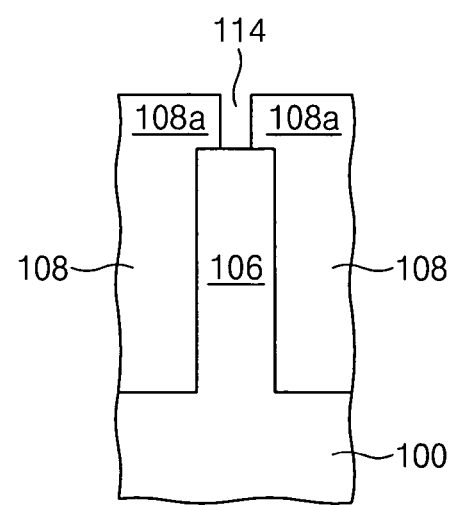

Referring to FIGS. 7A through 7C, the shrunken mask pattern 102b portion of the dummy gate line 110 is removed after an ion-implantation process is performed. The insulating layer 112 and the device isolating layer 108a thereby define a second opening 114. The second opening 114 exposes a portion of top surface of the active region 106.

Figure 8A:
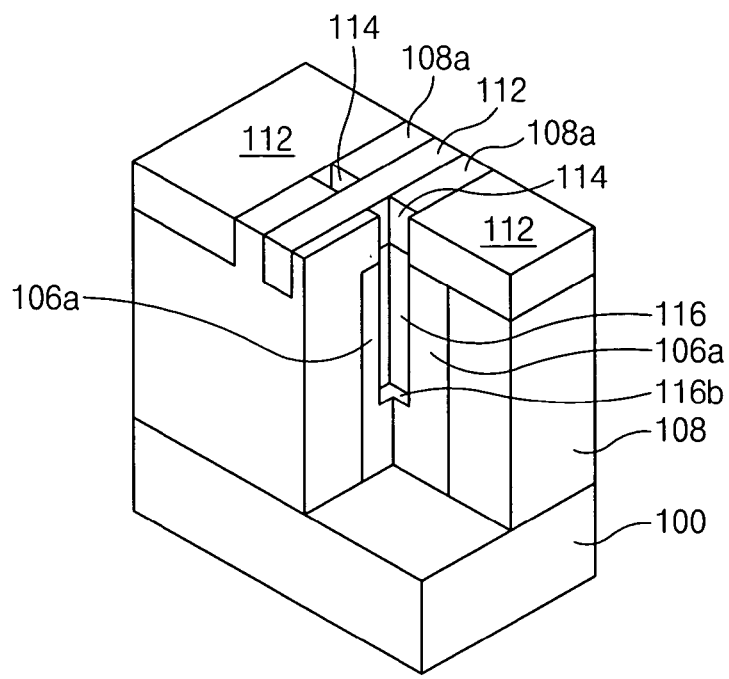
Figure 8B:
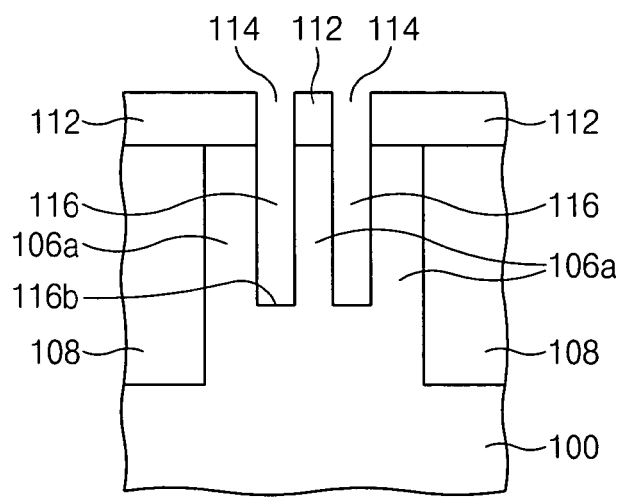
Figure 8C:
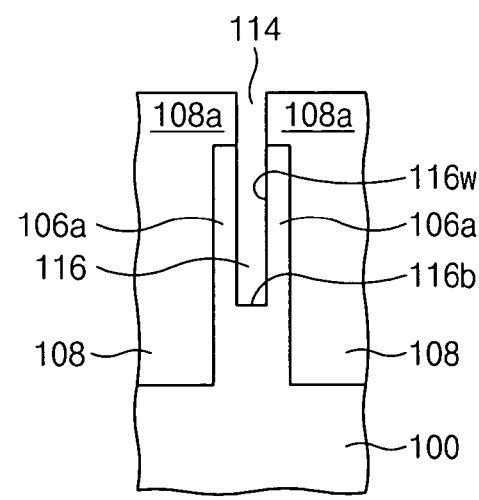

Referring to FIGS. 8A through 8C, the active region 106 exposed by the second opening 114 is etched to a predetermined depth to form a thin-body portion 106a of the substrate 100 surrounding a first opening or cavity 116. In other words, the first opening or cavity 116 is defined within the vertical thin body 106a by opposing sidewalls of the vertically protruding portion of the substrate 100. A width of the resultant thin body 106a depends on the amount of the mask pattern 102 that is removed. In other words, the amount of the mask pattern 102 that is removed may be adjusted so that the thin body may be formed to a desired width.

The ion implantation process may be performed after the shrunken mask pattern 102b is removed or after the first opening or cavity 116 is formed.

Figure 9A:
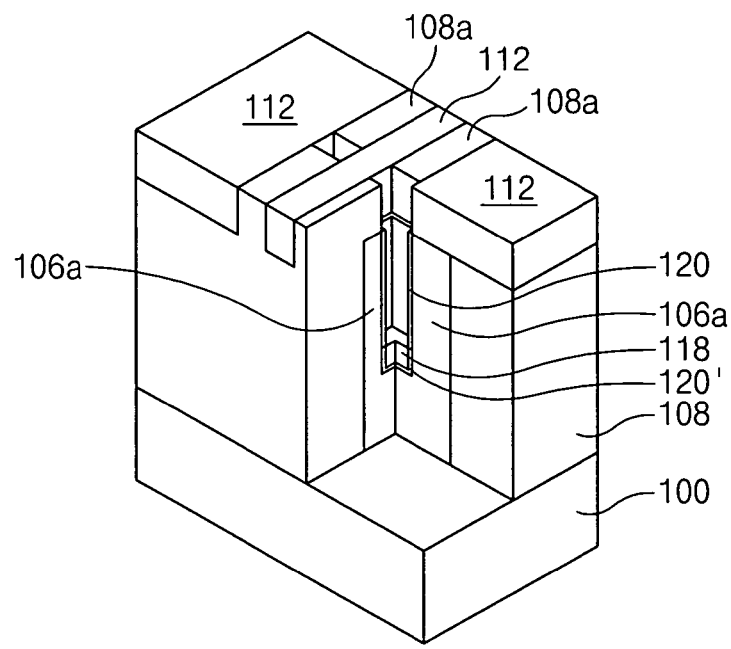
Figure 9B:
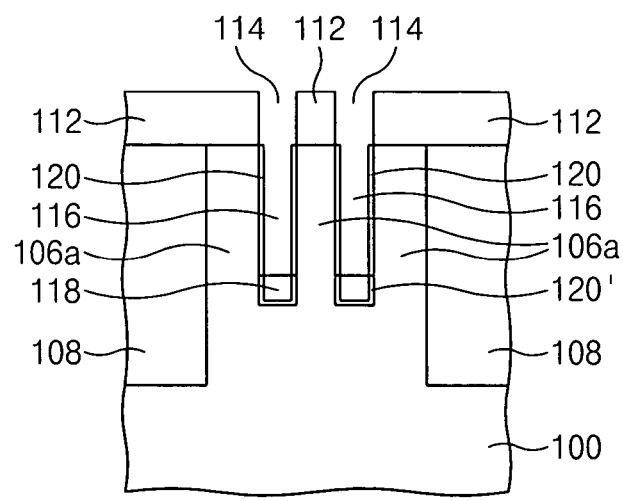
Figure 9C:
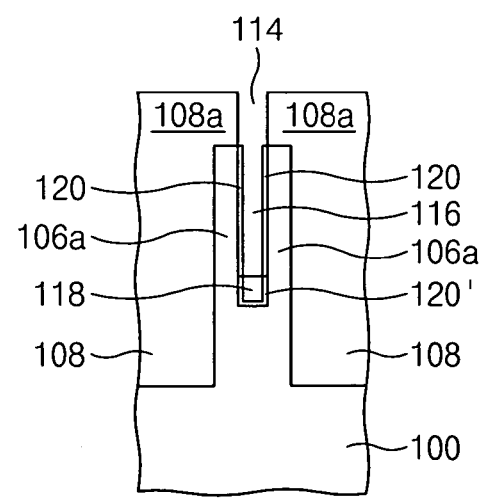

Referring to FIGS. 9A through 9C, gate insulating layers 120' and 120 are formed in the first opening or cavity 116 (i.e., on a bottom 116b and both sidewalls 116w of the first opening or cavity 116, respectively), and a lower insulating layer 118 is formed on the gate insulating layer 120' at the bottom 116b of the first opening or cavity 116. The lower insulating layer 118 may fill a lower portion of the first opening or cavity 116. As such, a lower portion of the thin body channel region 106a may not serve as a channel due to the lower insulating layer 118. In other words, the lower insulating layer 118 may prevent an inversion layer channel from being formed in the lower portion of the thin body channel region 106a. The lower insulating layer 118 may be formed of a silicon nitride layer, a non-doped silicon layer or a silicon oxide layer.

More specifically, after forming the first opening or cavity 116, a thermal oxidation process is performed to form a silicon oxide layer 120' in the first opening or cavity 116 (i.e. on the sidewalls and the bottom of the first opening or cavity 116). A lower insulating material is then formed on the insulating layer 112, the device isolation layer 108a, and the silicon oxide layer 120' in the first opening or cavity 116, so as to fill the first opening or cavity 116 and the second opening 114. Then, the lower insulating material is selectively removed (i.e. the lower insulating material is recessed in the first opening or cavity 116) to form a lower insulating layer 118 that fills a portion of the first opening or cavity 116.

For example, an etch back process may be applied to selectively etch the lower insulating material to form the lower insulating layer 118 on the bottom of the first opening or cavity 116. The silicon oxide layer 120' on the sidewalls of the first opening or cavity 116 exposed by the lower insulating layer 118 is then removed, leaving a portion of the silicon oxide layer 120' under the lower insulating layer 118.

Still referring to FIGS. 9A through 9C, a gate insulating layer 120 is formed on the exposed sidewalls of the first opening or cavity 116 in the active region 106. The gate insulating layer 120 may be formed by a thermal oxidation process. If the lower insulting layer 118 is formed of silicon oxide, the silicon oxide layer 120' on the sidewalls of the first opening or cavity 116 may be removed when the lower insulating material is recessed.

In other embodiments, the lower insulating layer 118 may not be formed on the bottom of the first opening or cavity 116. In such a case, a thermal oxidation process may be performed after forming the first opening or cavity 116 to form the gate insulating layer 120 on both sidewalls and the bottom of the first opening or cavity 116.

Figure 10A:
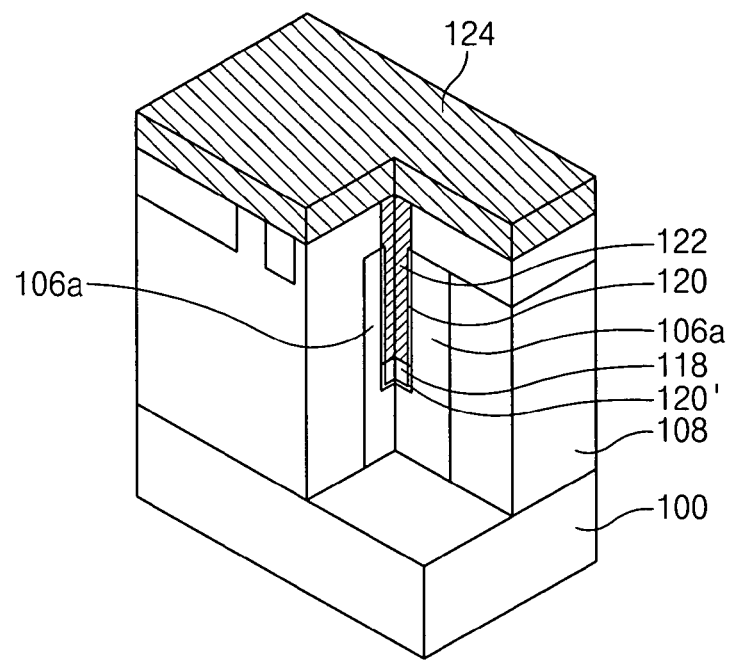
Figure 10B:
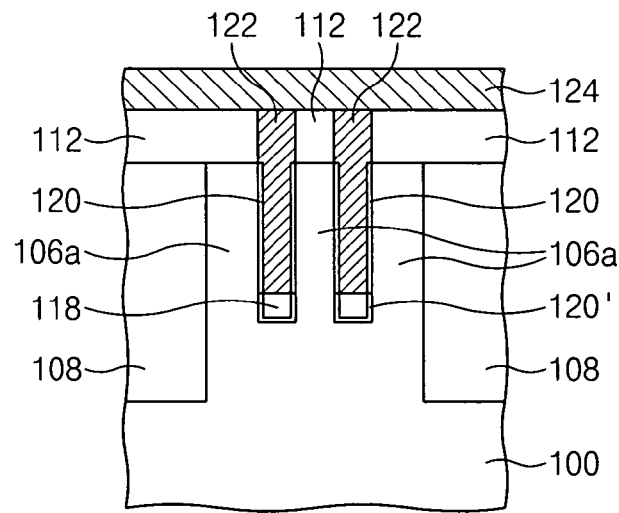
Figure 10C:
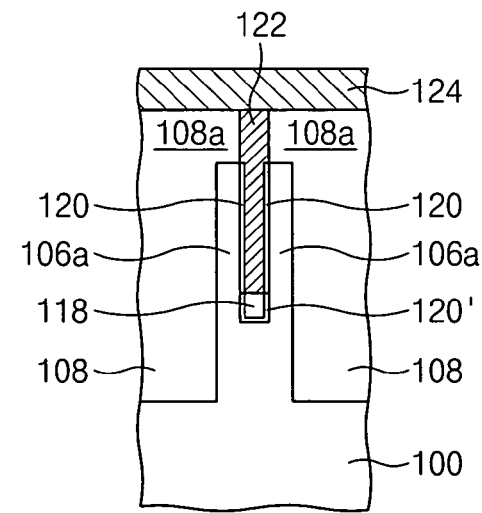

Referring to FIGS. 10A through 10C, a polysilicon layer 122 is formed to fill the first opening or cavity 116 and the second opening 114, and a heat-resistant metal layer 124 is formed on an entire surface of the substrate. The heat-resistant metal layer 124 may include, for example, nickel, chrome, titanium, etc.

Figure 11A:
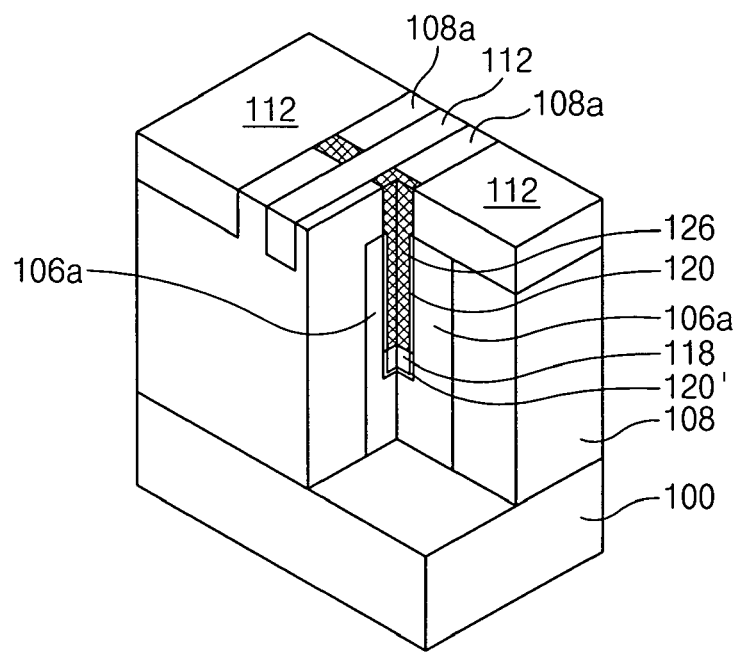
Figure 11B:
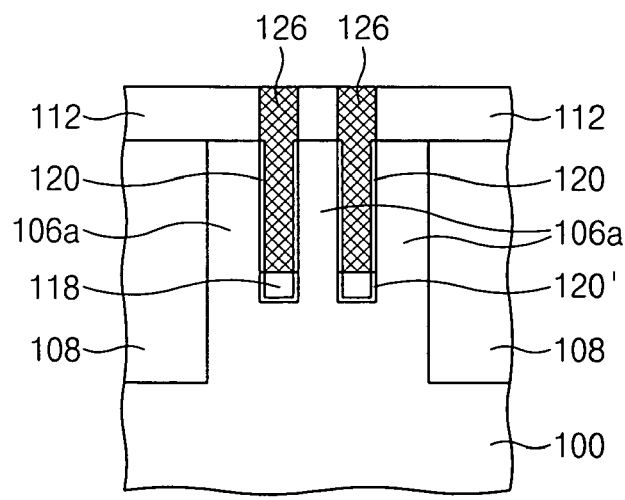
Figure 11C:
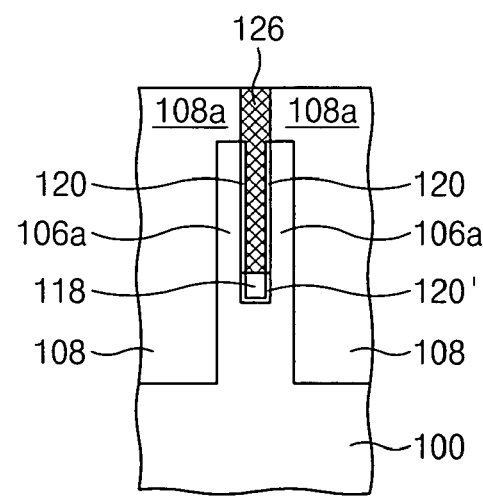

Referring to FIGS. 11A through 11C, a thermal treatment process is applied to form a silicide layer in the first and second openings 116 and 114, forming a vertically oriented portion 126 of the gate line 130. The heat-resistant metal layer 124 is then removed. By controlling the thermal treatment process (e.g., the thickness of the heat-resistant metal layer 124, the duration of the process, etc.), the silicide layer may be formed only in the first opening or cavity 116, or in both the first and second openings 116 and 114.

A conductive layer is then formed and patterned to form a laterally oriented portion 128 of the gate line 130 as illustrated in FIGS. 1A through 1C. The conductive layer may be formed of polysilicon, heat-resistant metal, or tungsten.

An ion implantation process is performed to form source/drain regions in a subsequent process.

In the above method, the silicide layer that forms the vertically oriented portion 126 of the gate line 130 may be formed using chemical vapor deposition (CVD). More specifically, the gate insulating layer may first be formed, and then the silicide layer may be formed to fill the first and second openings using chemical vapor deposition.

In alternate embodiments, the gate line 130 may be formed of polysilicon having a single layered structure. In such a case, a polysilicon layer is formed on the device isolating layer 108a and the insulating layer 112 to fill the first and second openings 116 and 114. The polysilicon layer is then patterned to form a vertically oriented portion and a laterally oriented portion simultaneously. Then, a tungsten or heat-resistant metal layer is formed and patterned to form the gate line 130.

When the vertically oriented portion 126 of the gate line 130 is formed of silicide, a potential advantage is that a gate doping process for forming a p-type transistor or an n-type transistor may not be required.

Referring now to FIGS. 12A through 18A, FIGS. 12B through 18B, and FIGS. 12C through 18C, methods of fabricating semiconductor devices according to further embodiments of the present invention will be described. FIGS. 12A through 18A are overhead views, and FIGS. 12B through 18B and FIGS. 12C through 18C are cross-sectional views corresponding to FIGS. 12A through 18A, taken along line I—I and line II—II in FIG. 12A, respectively.

Figure 12A:
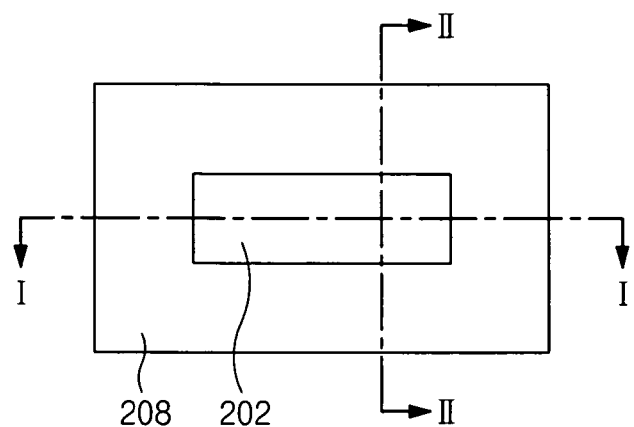
Figure 12B:
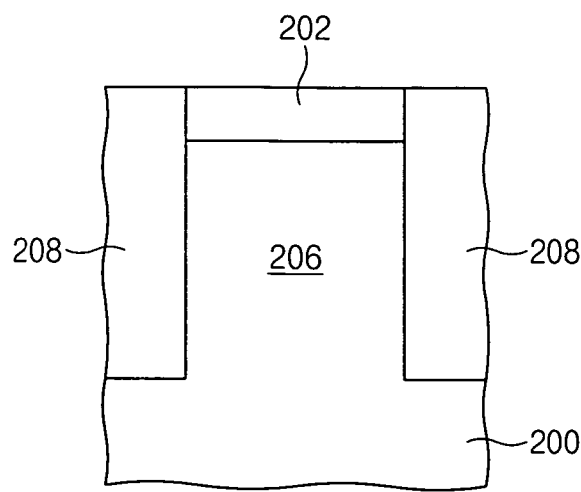
Figure 12C:
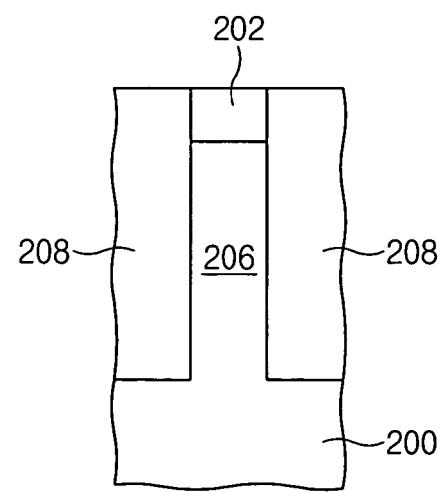

First, referring to FIGS. 12A through 12C, a substrate is etched to a predetermined depth to form a trench and to define an active region 206 where a thin-body channel region is to be formed, using a mask pattern 202 formed on the substrate 200 in a method similar to that explained with reference to FIGS. 2A through 2C. After the forming the active region 206, a device isolating layer 208 is formed, filling the trench and electrically insulating the active region.

Referring to FIGS. 13A through 13C, the device isolating layer 208 and the mask pattern 202 are patterned until top portions 206sj of the active region are exposed, thereby forming dummy gate lines 210. The exposed top portions 206sj of the active region 206 may be where source/drain regions may be formed in a subsequent process.

Figure 14A:
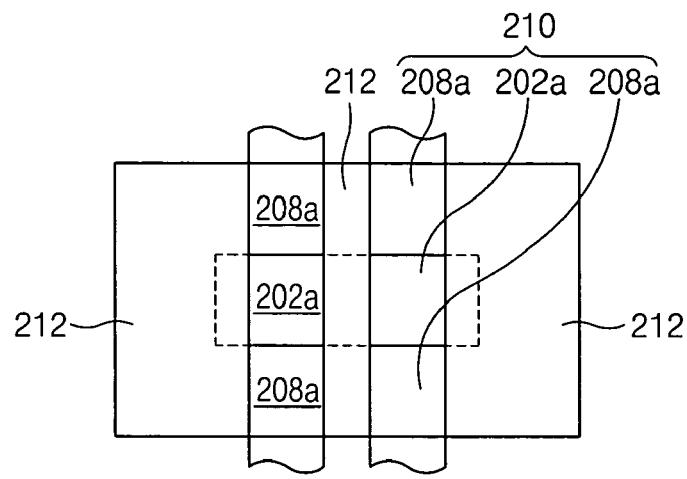
Figure 14B:
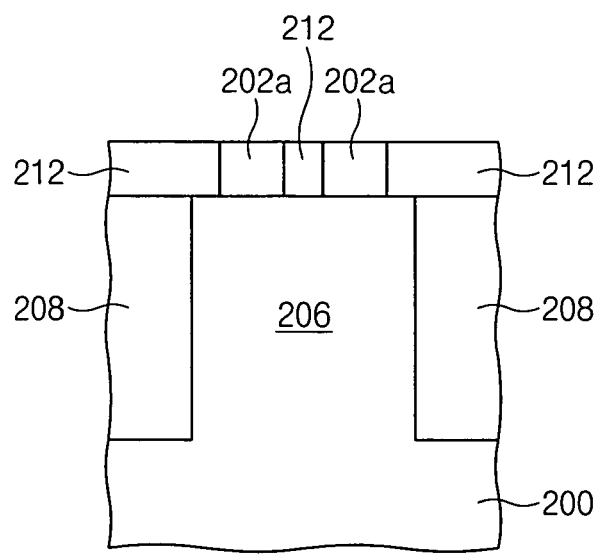
Figure 14C:
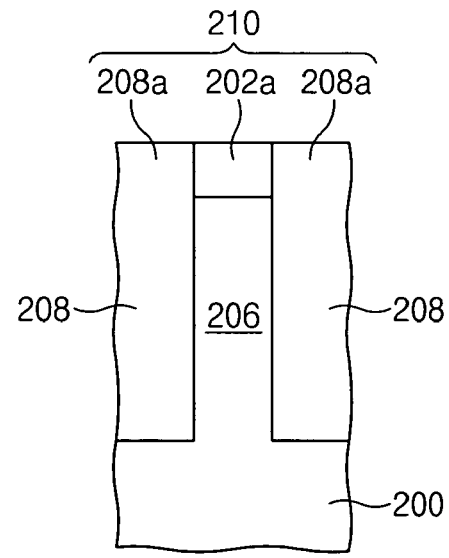

Referring to FIGS. 14A through 14C, an insulating layer 212 is formed to fill a region between the dummy gate lines 210. As such, a mask pattern 202a portion of the dummy gate line 210 is surrounded by the insulating layer 212 and the device isolating layer 208a, defined an "island" on the active region 206. In such a case, the insulating layer 212 may serve as a buffer layer in a subsequent ion-implantation process for forming source/drain regions.

Figure 15A:
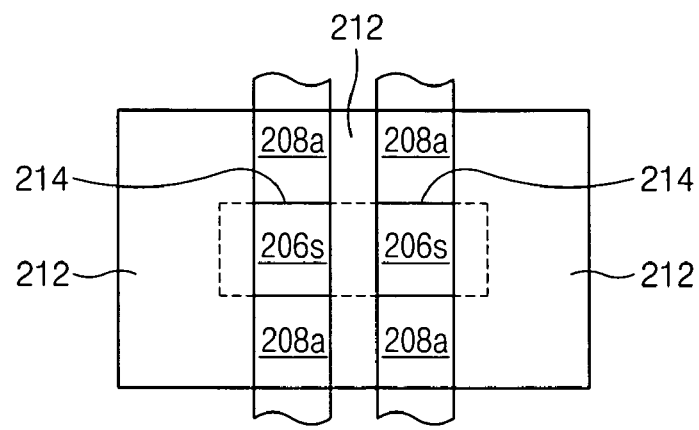
Figure 15B:
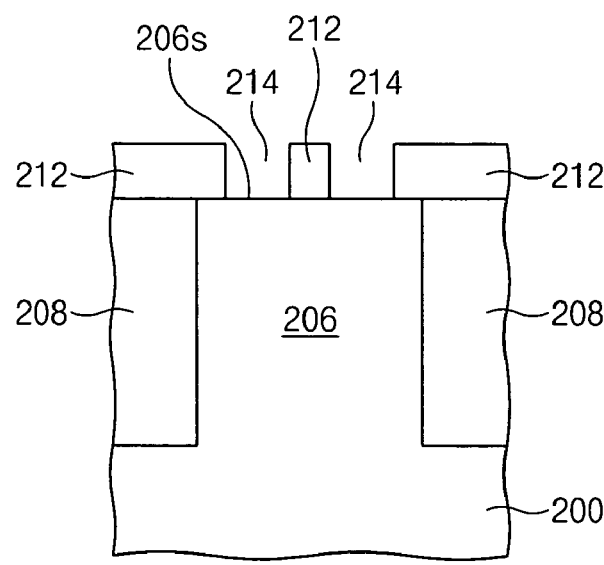
Figure 15C:
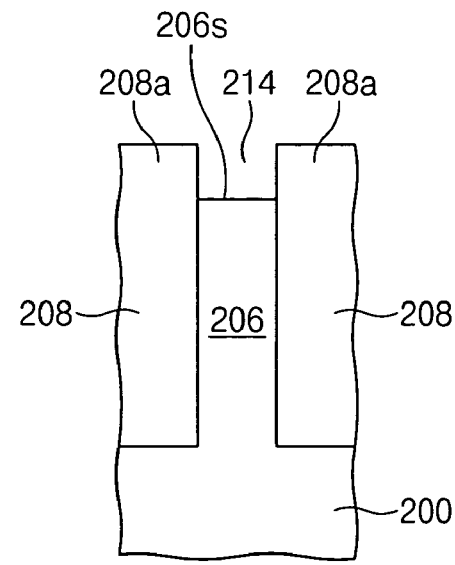

Referring to FIGS. 15A through 15C, after the ion-implantation process is performed, the residual mask pattern 202a is removed to form a second opening 214, exposing a top surface 206s of the active region 206. The second opening 214 is defined by the insulating layer 212 and the device isolating layer 208a.

Figure 16A:
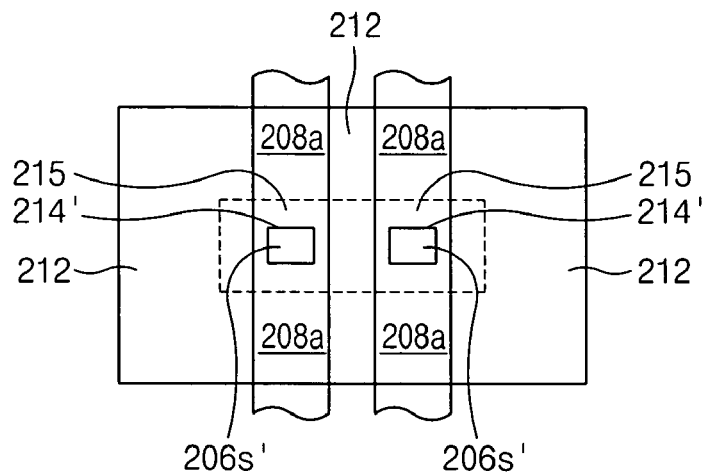
Figure 16B:
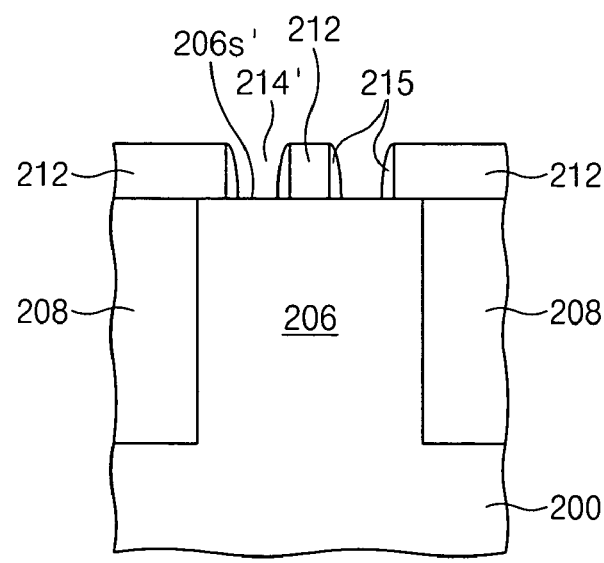
Figure 16C:
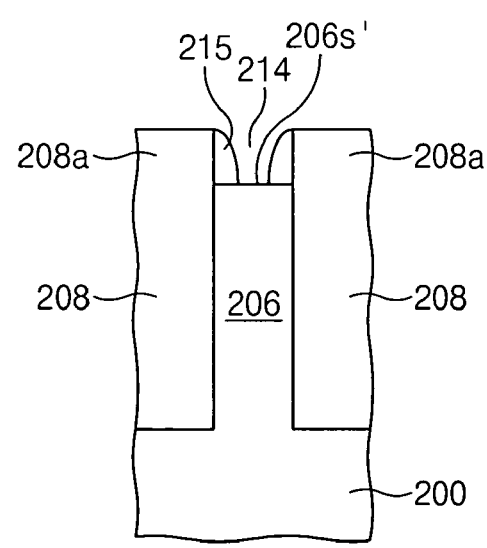

As illustrated in FIGS. 16A through 16C, spacers 215 are then formed on sidewalls of the second opening 214, thereby reducing the size of second opening 214 and forming a smaller second opening 214'. The width of the spacers 215 determines the channel width (i.e., the width of thin body channel region) that will be formed in a subsequent process. Therefore, by adjusting the width of spacers 215, the thin body channel region may be formed to a desired width. The spacers 215 may be formed by forming a silicon nitride layer using a thin film deposition technique, and etching back the silicon nitride layer. The spacers 215 may be formed of material having an etch selectivity with respect to silicon, such as silicon nitride or silicon oxide.

Figure 17A:
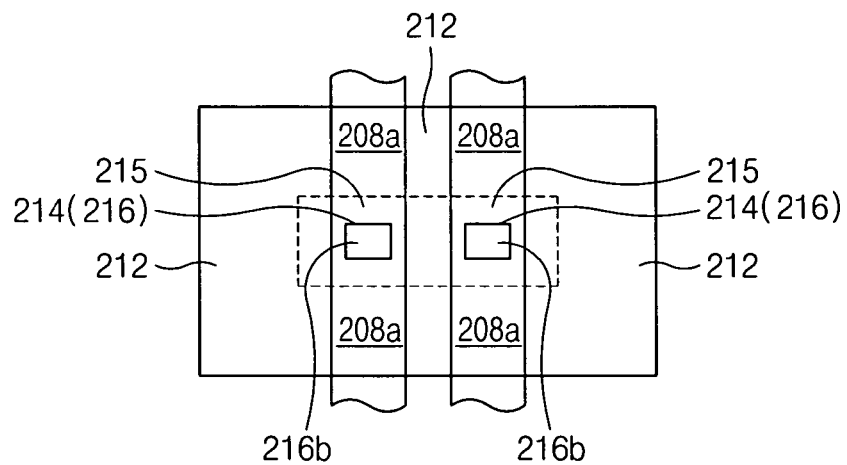
Figure 17B:
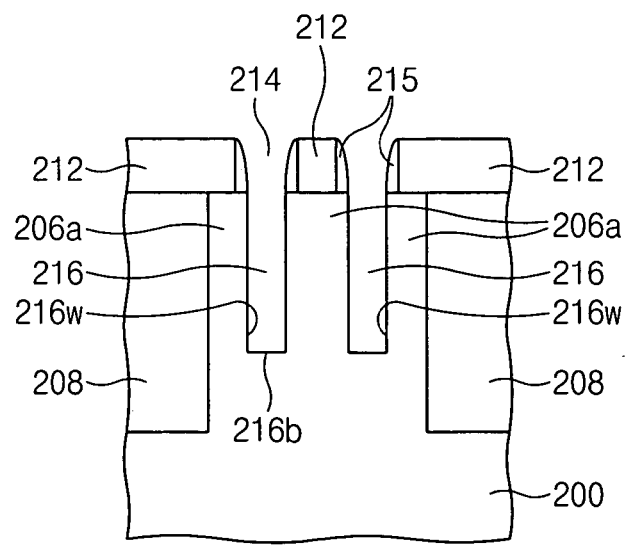
Figure 17C:
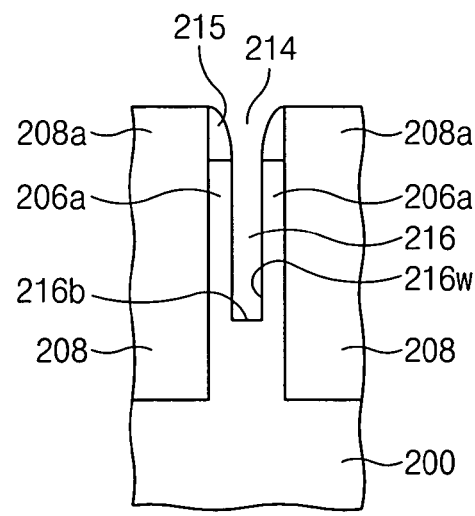

Referring to FIGS. 17A through 17C, the active region 206 exposed by the smaller second opening 214' is etched to a predetermined depth. As such, the active region 206 includes a first opening or cavity 216, and a thin body portion 206a of the substrate 200 is formed. An ion implantation process may be performed after the mask pattern 202a is removed or after the first opening or cavity 216 is formed.

Figure 18A:
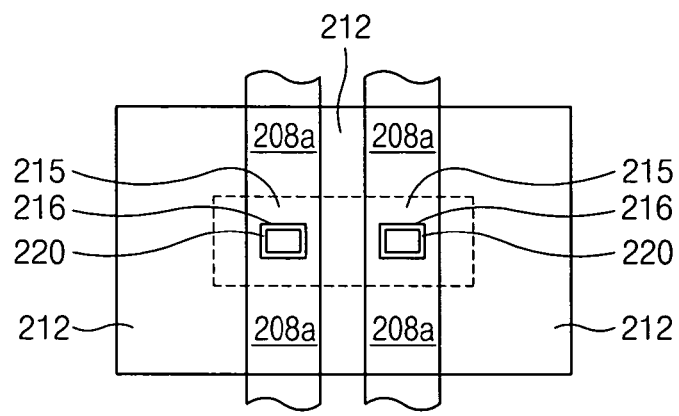
Figure 18A:
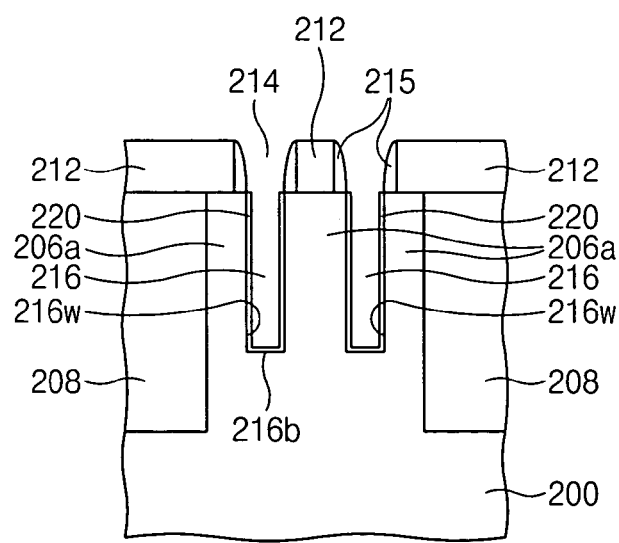
Figure 18B:
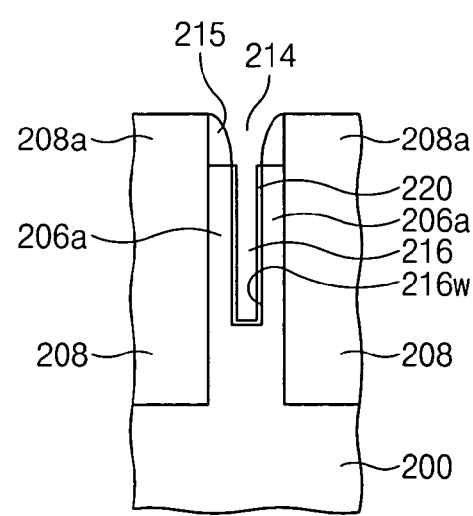

Referring to FIGS. 18A through 18C, a gate insulating layer 220 is formed on sidewalls 216w and the bottom 216b of the first opening or cavity 216. The gate insulating layer 220 may be formed using a thermal oxidation process.

Figure 19A:
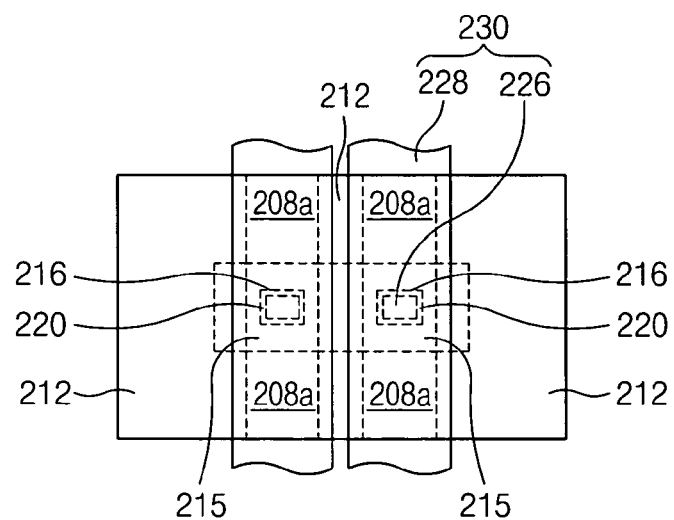
Figure 19B:
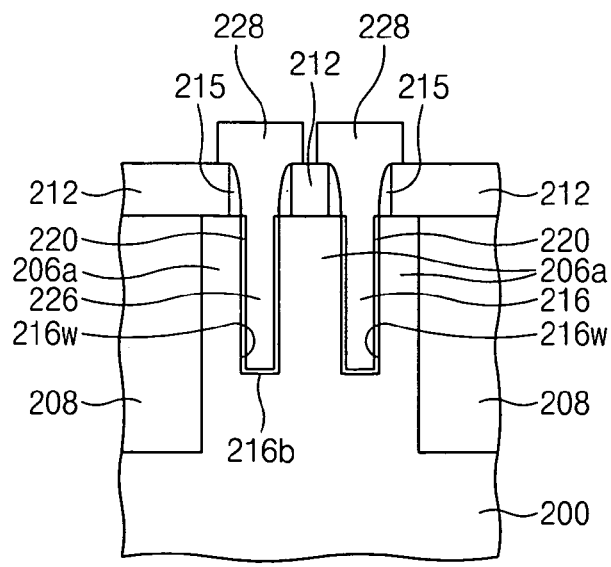
Figure 19C:
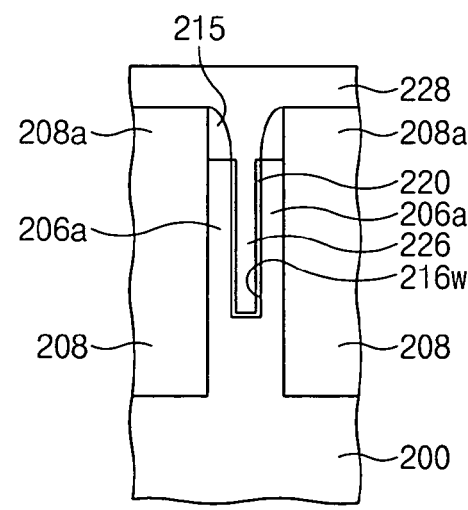

Next, referring to FIGS. 19A through 19C, a gate line 230 is formed. The gate line 230 crosses over (i.e. is formed on top of) the insulating layer 212 and the device isolating layer 208a, filling the first opening or cavity 216 and the smaller second opening 214'.

In other embodiments according to the present invention, a lower insulating layer may be formed on the bottom of the first opening or cavity 216. More specifically, after the first and second openings 216 and 214' are formed, a thermal oxidation process is performed and then a lower insulating material is formed to fill the first and second openings 216 and 214'. The lower insulating layer is then etched back to fill the bottom of the first opening or cavity 216. The thermal oxide layer formed on the sidewalls of the first opening or cavity 216 is then removed, and a gate insulating layer is formed thereon.

According to embodiments of the present invention, a vertical thin body transistor may be formed without using an SOI substrate, but instead using conventional trench isolation techniques. As compared with SOI substrate, the fabrication process can be simplified, costs can be reduced, and short channel effects can be reduced. In addition, floating body effects can be suppressed and a back bias voltage can be applied. Moreover, the size of the mask pattern or the width of the spacers may be controlled to form a thin body having a desired thickness.

Based on the above discussion, a flash memory device according to embodiments of the present invention may have improved data loading speeds and reduced power loss with reduced current consumption, as input data may be selected through an I/O pad such that the data load path to be programmed may be enabled while the data load path to be erased may be disabled.

Although the present invention has been described in connection with embodiments of the present invention illustrated in the accompanying drawings, it is not limited thereto. Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

The invention claimed is:

1. A field effect transistor, comprising:
   a vertically protruding thin-body portion of a semiconductor substrate having a first cavity defined by opposing sidewalls thereof;
   an insulating layer on the vertically protruding thin-body portion of the semiconductor substrate, the insulating layer having a second cavity defined by opposing sidewalls thereof, wherein the second cavity has a width that is substantially equal to a width of the first cavity;
   a vertically oriented gate electrode inside the first cavity and the second cavity, wherein the vertically oriented gate electrode is in direct contact with the opposing sidewalls of the insulating layer; and
   a gate insulating layer between the gate electrode and the opposing sidewalls of the vertically protruding thin-body portion of the semiconductor substrate.

2. The transistor of claim 1, further comprising:
   a laterally oriented gate electrode on the insulating layer and connected to a top portion of the vertically oriented gate electrode.

3. The transistor of claim 2, wherein the vertically oriented gate electrode comprises silicide, and wherein the laterally oriented gate electrode comprises one of polysilicon, metal, and metal silicide.

4. The transistor of claim 2, wherein the laterally oriented gate electrode has a width that is greater than a width of the vertically oriented gate electrode.

5. The transistor of claim 1, further comprising a layer inside the first cavity between a bottom portion of the first cavity and the semiconductor substrate, wherein the layer is configured to prevent formation of an inversion layer channel at a portion of the semiconductor substrate adjacent a bottom portion of the vertically oriented gate electrode.

6. The transistor of claim 5, wherein the layer is thicker than the gate insulating layer and comprises one of silicon nitride, silicon oxide, and undoped silicon.

7. The transistor claim 2, further comprising:
an insulating spacer on the opposing sidewalls of the insulating layer,
wherein the width of the second cavity is greater than the width of the first cavity, and wherein the vertically oriented gate electrode is in direct contact with the insulating spacer.

8. The transistor claim 7, wherein sides of the second cavity are self-aligned to sides of the insulating spacer.

9. The transistor claim 2, wherein the first cavity comprises a contact hole type cavity.

10. The transistor claim 9, wherein the vertically oriented gate electrode comprises silicide, and wherein the laterally oriented gate electrode comprises one of polysilicon, metal, and metal silicide.

11. The transistor claim 9, further comprising:
a layer inside the first cavity between a bottom portion of the first cavity and the semiconductor substrate, wherein the layer is configured to prevent formation of an inversion layer channel at a portion of the semiconductor substrate adjacent a bottom portion of the vertically oriented gate electrode.

12. The transistor claim 11, wherein the layer is thicker than the gate insulating layer and comprises one of silicon nitride, silicon oxide, and undoped silicon.

13. A field effect transistor in a non-volatile EPROM, comprising:
a first T-shaped gate electrode having a lateral portion on a top surface of a semiconductor substrate and having a vertical portion at least partially inside a first cavity defined by opposing sidewalls of a vertically protruding portion of the substrate; and
a second T-shaped gate electrode having a lateral portion on a top surface of the substrate and having a vertical portion at least partially inside a second cavity defined by opposing sidewalls of the vertically protruding portion of the substrate,
wherein the lateral portion of the second T-shaped gate electrode is substantially parallel to the lateral portion of the first T-shaped gate electrode, and wherein the vertical portion of the second T-shaped gate electrode is substantially parallel to the vertical portion of the first T-shaped gate electrode.

14. A field effect transistor, comprising:
a vertically protruding thin-body portion of a semiconductor substrate having a first cavity defined by opposing sidewalls thereof;
an insulating layer on the vertically protruding thin-body portion of the semiconductor substrate, the insulating layer having a second cavity defined by opposing sidewalls thereof, wherein the second cavity has a width that is substantially equal to a width of the first cavity;
a vertically oriented gate electrode inside the first cavity and the second cavity, wherein the vertically oriented gate electrode is in direct contact with the opposing sidewalls of the insulating layer;
a gate insulating layer between the gate electrode and the opposing sidewalls of the vertically protruding thin-body portion of the semiconductor substrate; and
a laterally oriented gate electrode on the insulating layer and connected to a top portion of the vertically oriented gate electrode,
wherein the first cavity comprises a contact hole type cavity.

15. A field effect transistor on an active region of a semiconductor substrate, comprising:
a vertically protruding thin-body portion of the semiconductor substrate;
a first vertically oriented gate electrode at least partially inside a first cavity defined by opposing sidewalls of the vertically protruding portion of the substrate; and
a second vertically oriented gate electrode at least partially inside a second cavity defined by opposing sidewalls of the vertically protruding portion of the substrate.

16. The transistor of claim 15, further comprising:
an insulating layer surrounding an upper portion of the first and second vertically oriented gate electrodes;
a first laterally oriented gate electrode on the insulating layer and connected to a top portion of the first vertically oriented gate electrode; and
a second laterally oriented gate electrode on the insulating layer and connected to a top portion of the second vertically oriented gate electrode.

17. The transistor of claim 16, wherein the vertically oriented gate electrodes comprise silicide, and wherein the laterally oriented gate electrodes comprise metal.

18. The transistor of claim 16, wherein the first laterally oriented gate electrode has a width that is greater than a width of the first vertically oriented gate electrode.

* * * * *